US011307637B2

(12) United States Patent
Lee et al.

(10) Patent No.: US 11,307,637 B2
(45) Date of Patent: Apr. 19, 2022

(54) UNIVERSAL FLASH STORAGE MEMORY CARD

(71) Applicant: SAMSUNG ELECTRONICS CO., LTD., Suwon-si (KR)

(72) Inventors: In-Jae Lee, Seoul (KR); Min-Woo Kim, Seoul (KR); Seung Wan Koh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/931,940

(22) Filed: Jul. 17, 2020

(65) Prior Publication Data

US 2021/0191501 A1   Jun. 24, 2021

(30) Foreign Application Priority Data

Dec. 18, 2019   (KR) .................. 10-2019-0170126

(51) Int. Cl.
*G06F 1/3234* (2019.01)
*G06F 1/04* (2006.01)
(Continued)

(52) U.S. Cl.
CPC .............. *G06F 1/3275* (2013.01); *G06F 1/04* (2013.01); *G06F 13/1668* (2013.01); *H01R 12/721* (2013.01)

(58) Field of Classification Search
CPC ...... G06F 1/3275; G06F 1/04; G06F 13/1668; H01R 12/721
See application file for complete search history.

(56) References Cited

U.S. PATENT DOCUMENTS 7,305,535 B2   12/2007   Harari et al.
9,047,547 B2   6/2015    Okada
(Continued)

FOREIGN PATENT DOCUMENTS

CN          106355231 A    1/2017
CN          109948767 A    6/2019
KR     10-2006-0031123 A    4/2006

OTHER PUBLICATIONS

Samsung UFS Card: "State-of-the-Art Storage Card Delivering Superior Performance and Reliability: SSD Performance in a Memory Card", White Paper; Samsung Electronics Co., Ltd.; May 2018. (Year: 2018).*

*Primary Examiner* — Glenn A. Auve
(74) *Attorney, Agent, or Firm* — Sughrue Mion, PLLC

(57) ABSTRACT

A memory card includes a first ground terminal arranged in a first row that provides a ground voltage to at least one nonvolatile memory or a memory controller, universal flash storage (UFS) terminals arranged in a second row including a first UFS terminal that provides a second power, a second UFS terminal that provides a reference clock signal, and a third UFS terminal that provides a path for input/output data to the memory controller, and a first power terminal arranged in a third row that provides a first power supply voltage (VCC) to the at least one nonvolatile memory or the memory controller. The memory card has a size defined by a nano subscriber identification module (SIM) card standard, the first ground terminal corresponds to a "C5" terminal of the nano SIM card standard, and the first power terminal corresponds to a "C1" terminal of the nano SIM card standard.

20 Claims, 13 Drawing Sheets

(51) Int. Cl.
G06F 13/16 (2006.01)
H01R 12/72 (2011.01)

(56) References Cited

U.S. PATENT DOCUMENTS

| | | | |
|---|---|---|---|
| 9,635,549 B2* | 4/2017 | Chen | H04W 8/183 |
| 10,027,079 B2* | 7/2018 | Lu | G06K 19/07732 |
| 10,347,345 B2 | 7/2019 | Han et al. | |
| 10,403,329 B2 | 9/2019 | Han et al. | |
| 2017/0125932 A1* | 5/2017 | Wei | H01R 13/514 |
| 2017/0352998 A1* | 12/2017 | Lee | H01R 12/7005 |
| 2018/0189002 A1* | 7/2018 | Seo | H04B 1/401 |
| 2018/0286466 A1* | 10/2018 | Han | G11C 5/06 |
| 2019/0182954 A1 | 6/2019 | Sirajudeen et al. | |
| 2019/0205277 A1* | 7/2019 | Koh | G06F 12/0246 |
| 2019/0354493 A1* | 11/2019 | Sunwoo | G06F 1/266 |
| 2021/0117748 A1* | 4/2021 | Yang | G06K 19/07743 |

* cited by examiner

UNIVERSAL FLASH STORAGE MEMORY CARD

CROSS-REFERENCE TO THE RELATED APPLICATIONS

This application is based on claims priority from 35 U.S.C. § 119 to Korean Patent Application No. 10-2019-0170126 filed on Dec. 18, 2019, in the Korean Intellectual Property Office, the disclosures of which are incorporated by reference herein in their entireties.

BACKGROUND

1. Field

Embodiments of the inventive concept disclosed herein relate to a semiconductor memory device, and more particularly, relate to an universal flash storage (UFS) memory card having a same size or a same dimension as a subscriber identification module (SIM) card.

2. Description of Related Art

Recently, as technologies for a storage medium develop, various kinds of memory cards are being used as storage of mobile devices. Moreover, various standards are used to decide a format of a memory card, and shapes, sizes and dimensions vary depending on the format of the memory card. As such, the use of a universal flash storage (UFS) card is increasing depending on a demand on a high-speed and high-capacity storage device.

In addition, an integrated circuit card (hereinafter referred to as a "SIM card") implementing a subscriber identification module (SIM) is generally used in a mobile device. In general, a memory card and a SIM card are mounted on one socket tray so as to be inserted into a mobile device. However, in some cases, a plurality of SIM cards may be mounted on one socket tray, and the standard for a nano SIM card having a size of 15 mm×11 mm is most commonly used.

However, a space of a socket tray may be wasted due to a size difference of the UFS card used as a memory card and the nano SIM card.

SUMMARY

Embodiments of the inventive concept provide a memory card based on UFS standard, which as a same size as a SIM card. For instance, the embodiments of the inventive concept provide an UFS memory card having a same size as a nano SIM card.

According to an aspect of the disclosure, there is provided a memory card which includes at least one nonvolatile memory and a memory controller, the memory card comprising: a first ground terminal arranged in a first row, and configured to provide a ground voltage to the at least one nonvolatile memory or the memory controller; a plurality of universal flash storage (UFS) terminals arranged in a second row; and a first power terminal arranged in a third row, and configured to provide a first power supply voltage (VCC) to the at least one nonvolatile memory or the memory controller, wherein the plurality of UFS terminals comprises a first UFS terminal configured to provide a second power, a second UFS terminal configured to provide a reference clock signal, and a third UFS terminal configured to provide a path for input/output data to the memory controller, wherein the memory card has a size or a dimension defined by a nano subscriber identification module (SIM) card standard, wherein the first ground terminal corresponds to a "C5" terminal of the nano SIM card standard, and wherein the first power terminal corresponds to a "C1" terminal of the nano SIM card standard.

According to another aspect of the disclosure, there is provided a combo card which includes at least one nonvolatile memory, a memory controller controlling the at least one nonvolatile memory, and a SIM controller storing or providing subscriber information, the combo card comprising: a first terminal group including a "C5" terminal, a "C6" terminal, and a "C7" terminal of a nano SIM card standard arranged in a first row of a back surface of the combo card; a second terminal group including universal flash storage (UFS) terminals arranged in a second row of the back surface and providing a power, a reference clock signal, and a path for input/output data to the memory controller; and a third terminal group including a "C1" terminal, a "C2" terminal, and a "C3" terminal of the nano SIM card standard arranged in a third row of the back surface, wherein the combo card has a size or a dimension of 12.3 mm×8.8 mm.

According to another aspect of the disclosure, there is provided a memory card which includes at least one nonvolatile memory and a memory controller and has a size or a dimension of 12.3 mm×8.8 mm, the memory card comprising: a first ground terminal arranged in a first row to provide a ground voltage to the at least one nonvolatile memory or the memory controller; a plurality of universal flash storage (UFS) terminals arranged in a second row to transfer a power, a reference clock signal, and data to the memory controller; and a first power terminal formed at a third row to provide a first power supply voltage (VCC) to the at least one nonvolatile memory or the memory controller, wherein the plurality of UFS terminals comprises a first UFS terminal configured to provide a second power to the memory controller, a second UFS terminal configured to provide a reference clock signal, and a third UFS terminal configured to provide data to the memory controller.

According to another aspect of the disclosure, there is provided a universal flash storage (UFS) memory card comprising: a first ground terminal arranged in a first area, and configured to provide a ground voltage to at least one nonvolatile memory or a memory controller; a plurality of UFS terminals arranged in a second area; and a first power terminal arranged in a third area and configured to provide a first power supply voltage (VCC) to the at least one nonvolatile memory or the memory controller, wherein the second area is between the first area and the third area in a plan view of the memory card, wherein the UFS terminals comprises a first UFS terminal configured to provide a second power, a second UFS terminal configured to provide a reference clock signal, and a third UFS terminal configured to provide a path for input/output data to the memory controller, and wherein the memory card has a dimension defined by a nano subscriber identification module (SIM) card standard.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
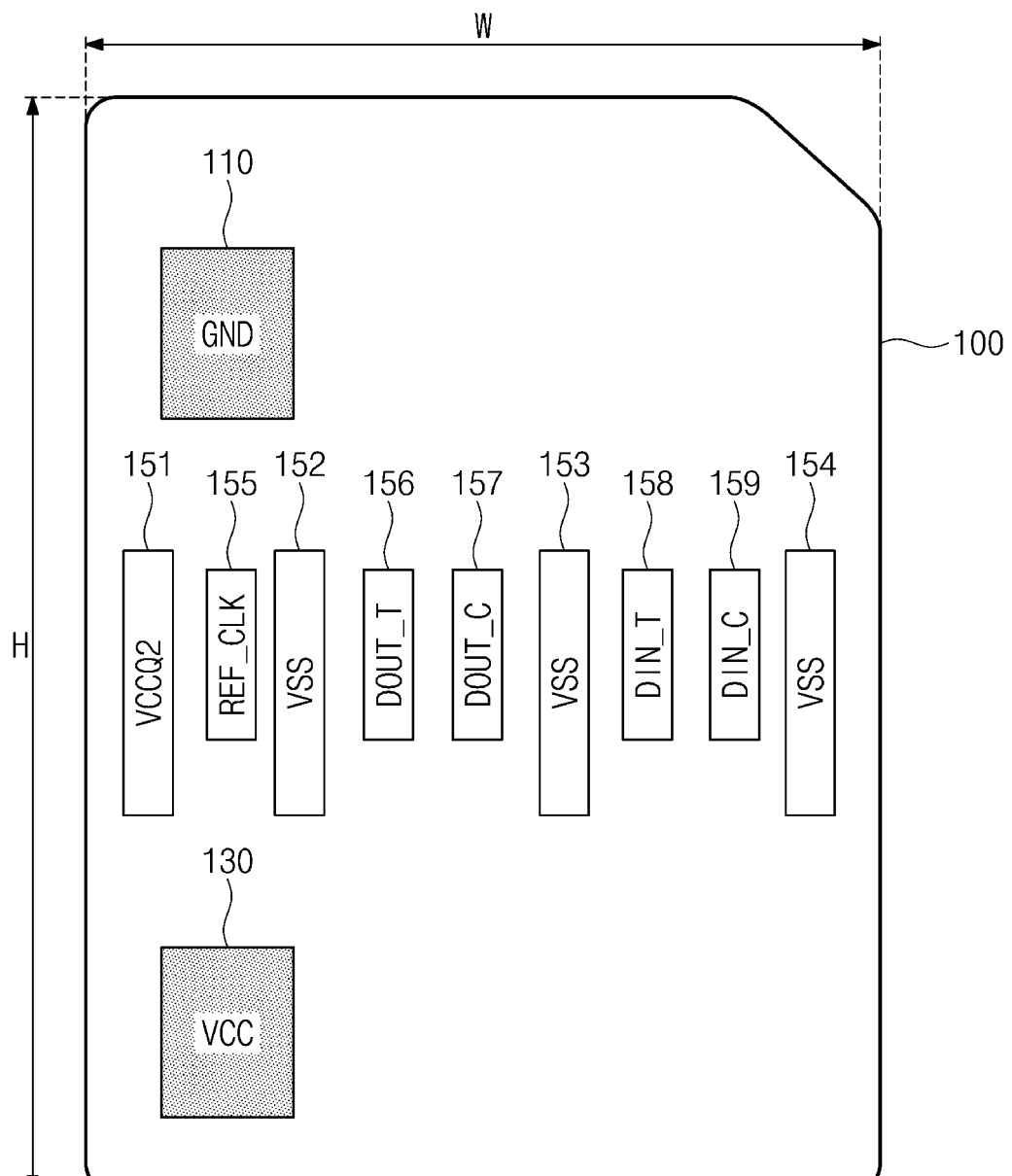
FIG. 1 is a plan view illustrating a memory card according to an example embodiment of the inventive concept.

It should be understood that both the foregoing general description and the following detailed description are provided as examples, and as such, these descriptions should not be regarded as limiting the scope of the disclosure. Reference numerals will be represented in detail in embodiments of the inventive concept, examples of which are illustrated in the accompanying drawings. Wherever possible, the same reference numerals are used in the drawings and the description to refer to the same or similar parts.

Below, a storage device using a flash memory device will be exemplified to describe features and functions of the inventive concept. However, one skilled in the art may easily understand other merits and performance of the inventive concept depending on the content disclosed here. The inventive concept may be implemented or applied through other embodiments. In addition, the detailed description may be changed or modified depending on view points and applications without departing from the claims, the scope and spirit, and any other purposes of the inventive concept.

FIG. 1 is a plan view illustrating a memory card according to an example embodiment of the inventive concept. Referring to FIG. 1, a memory card 100 may have the same width "W" and the same height "H" as a nano SIM card. The memory card 100 may include terminals 110 and 130 formed to be identical in position to terminals C5 and C1 in compliance compliant with the nano SIM card standard, and UFS terminals 151 to 159 interposed between the terminals 110 and 130. In the following description below, a top area in a second direction D2 may be referred to as a "first row", a middle area in the second direction D2, in which the UFS terminals 151 to 159 are arranged, may be referred to as a "second row", and a bottom area in the second direction D2 may be referred to as a "third row".

The terminal 110 at the first row may be provided as a first ground terminal GND for providing a ground voltage of the memory card 100. The first ground terminal 110 may be formed, for example, at the same position as the ground terminal C5 of the nano SIM card. The terminal 130 at the third row may be provided as a first power terminal for providing a power supply voltage VCC of the memory card 100. The first power terminal 130 may be formed, for example, at the same position as the power terminal C1 of the nano SIM card. The power supply voltage VCC may have a value between 3 V and 5 V. For example, the power supply voltage VCC of 3.3 V may be provided. The first ground terminal 110 and the first power terminal 130 may be formed to be substantially identical in position and size to the ground terminal C5 and the power terminal C1 of the nano SIM card.

Furthermore, the UFS terminals 151 to 159 may be arranged at the second row. According to the standard of the nano SIM card of the same size as the memory card 100 of the inventive concept, USB signal terminals C4 and C8 are disposed at the second row where the UFS terminals 151 to 159 are arranged. However, in general, the USB signal terminals C4 and C8 are not used in a mobile device. Accordingly, even though the UFS terminals 151 to 159 are formed in the memory card 100 of the inventive concept, a collision issue does not occur. The UFS terminals 151 to 159 may be divided into a plurality of power terminals 151, 152, 153, and 154, a reference clock terminal 155, and data terminals 156, 157, 158, and 159.

According to an example embodiment, the second power terminal 151 of the plurality of power terminals 151, 152, 153, and 154 is provided to receive a second power supply voltage VCCQ2 for driving the memory card 100. Here, the second power supply voltage VCCQ2 may have, for example, a value between approximately 1.0 V and approximately 2.2 V. The second power supply voltage VCCQ2 may be supplied to semiconductor devices operating at a high speed from among semiconductor devices in the memory card 100. For example, the second power supply voltage VCCQ2 may be supplied to a memory controller in the memory card 100.

The third power terminals 152, 153, and 154 of the plurality of power terminals 151, 152, 153, and 154 may be provided to receive a third power supply voltage VSS. Here, the third power terminals 152, 153, and 154 to which the third power supply voltage VSS is provided may be electrically connected with the first ground terminal 110. That is, the third power supply voltage VSS may be provided as a ground voltage GND.

The reference clock terminal 155 may be arranged between the second power terminal 151 and the second power terminal 152. According to an example embodiment, a distance between the reference clock terminal 155 and the memory controller may be minimized for a high-speed operation. Also, because a position of the memory controller may be changed depending on a design of the memory card 100, it is advantageous to place the reference clock terminal 155 on the center of the memory card 100 according to an example embodiment.

The data output terminals 156 and 157 are arranged between the third power terminals 152 and 153. The data output terminals 156 and 157 may be terminals to output a differential signal. Accordingly, mutual interference or crosstalk may be minimized by disposing the third power terminal 152 set to a ground level between the data output terminals 156 and 157 and the reference clock terminal 155.

The data input terminals 158 and 159 are arranged between the third power terminals 153 and 154. The data input terminals 158 and 159 may be terminals to receive a differential signal. A noise or interference of an input signal provided to the data input terminals 158 and 159 may be minimized by disposing the data input terminals 158 and 159 between the third power terminals 153 and 154 set to the ground level.

According to an example embodiment, a card detection terminal C/D may be further included in the second row of the UFS card. For instance, the card detection terminal C/D may be arranged in addition to the UFS terminals 151 to 159. The card detection terminal C/D is a terminal for recognizing that the memory card 100 inserted into a socket of a mobile device is a UFS card.

For example, the memory card 100 may be attached to or detached from (or may be removable from) a mobile device using the memory card 100 in the second direction D2. Each of the UFS terminals 151 to 159 may be arranged in such a way that a length in the second direction D2 is greater than a length in a first direction D1. Accordingly, when inserted into a card slot in the second direction D2, contact pins in the mobile device and the UFS terminals 151 to 159 may be connected to be highly reliable.

In addition, the UFS terminals 151 to 159 are arranged at positions corresponding to the USB signal terminals C4 and C8 compliant with the nano SIM card standard of the same size. That is, the UFS terminals 151 to 159 are arranged in the first direction D1 at a card center portion between the first ground terminal 110 and the first power terminal 130. Nowadays, the USB signal terminals C4 and C8 are seldom used in mobile devices. Accordingly, even though the memory card 100 of the inventive concept is inserted into a nano SIM card slot, the collision between the data signals does not occur. Also, the first ground terminal 110 and the first power terminal 130 are formed at the same positions as the power terminal C1 and the ground terminal C5 of the nano SIM card of the same size. Accordingly, the first ground terminal 110 and the first power terminal 130 may be used in common with the power terminal C1 and the ground terminal C5 of the nano SIM card standard.

The shapes and arrangements of contact terminals of the memory card 100 of the inventive concept are briefly described above. The memory card 100 of the inventive concept may have, for example, a width (W) of 8.8 mm and a height (H) of 12.3 mm. The size of the memory card 100 is identical to the size of the nano SIM card. Although having the same size and shape as the nano SIM card, the UFS terminals 151 to 159 of the memory card 100 for exchanging data and a clock signal are arranged at positions of the unused USB signal terminals C4 and C8 of the nano SIM card.

Figure 2:
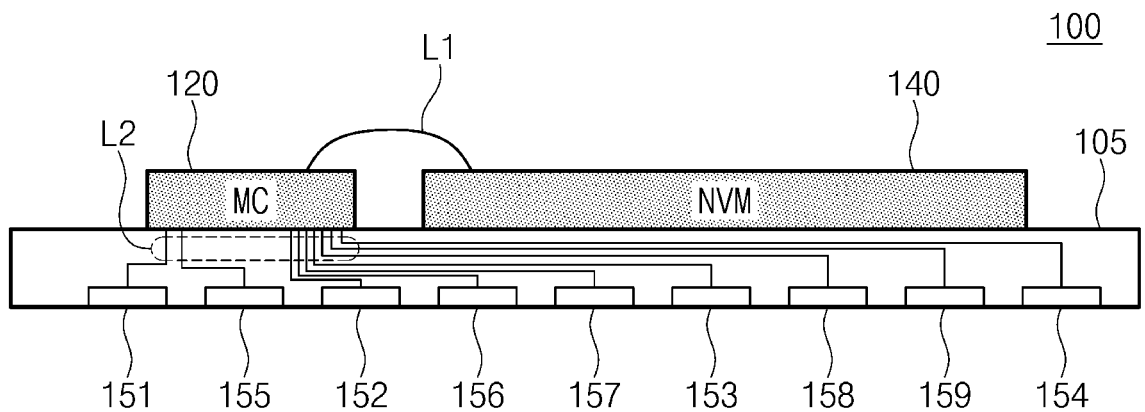
FIG. 2 is a cross-sectional view schematically illustrating a configuration of a memory card of FIG. 1.
Figure 2:
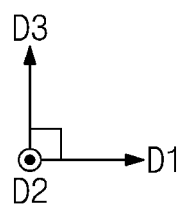

FIG. 2 is a cross-sectional view schematically illustrating a configuration of a memory card of FIG. 1. Referring to FIG. 2, the memory card 100 includes a memory controller 120 and a nonvolatile memory 140 disposed on an upper surface of a substrate 105. The first ground terminal 110, the first power terminal 130, and the UFS terminals 151 to 159 may be arranged on a lower surface of the substrate 105. However, positions, sizes, and a connection relationship of components mentioned herein are exemplary, and the positions, sizes, and connection relationship are not limited to the disclosure.

The memory controller 120 is connected with the nonvolatile memory 140 through a wire L1. The wire L1 may include a plurality of data lines for exchanging a command, an address, data, and a control signal between the memory controller 120 and the nonvolatile memory 140. The wire L1 is illustrated in the form of a bonding wire electrically connecting the memory controller 120 and the nonvolatile memory 140, but the inventive concept is not limited thereto. That is, the wire L1 may be implemented by using a silicon through via (TSV) and a printed circuit pattern formed on the substrate 105.

The first ground terminal 110, first power terminal 130, and the UFS terminals 151 to 159 are electrically connected with the memory controller 120 through wires L2. Here, because FIG. 2 is the cross-sectional view of the memory card 100 taken along the second row, the first ground terminal 110 and the first power terminal 130 are not shown. The UFS terminals 151 to 159 may be connected with the memory controller 120 via a separate wire L2. The UFS terminals 151 to 159 may be electrically connected with the memory controller 120 through a wire, a printed circuit pattern formed on an upper or lower surface of the substrate 105, or a wire layer or a through via (TSV) formed in the substrate 105.

According to an example embodiment, the nonvolatile memory 140 may be electrically connected with the first ground terminal 110 and the first power terminal 130. That is, the nonvolatile memory 140 may be connected with the first ground terminal 110 and the first power terminal 130 through a wire, a printed circuit pattern formed on the upper or lower surface of the substrate 105, or a wire layer or a through via (TSV) formed in the substrate 105.

An exemplary cross-sectional view of the memory card 100 of the inventive concept is illustrated and described above. However, it may be well understood that positions of the memory controller 120 and the nonvolatile memory 140 are variously changed depending on a design purpose and are not limited to the above disclosure.

Figure 3:
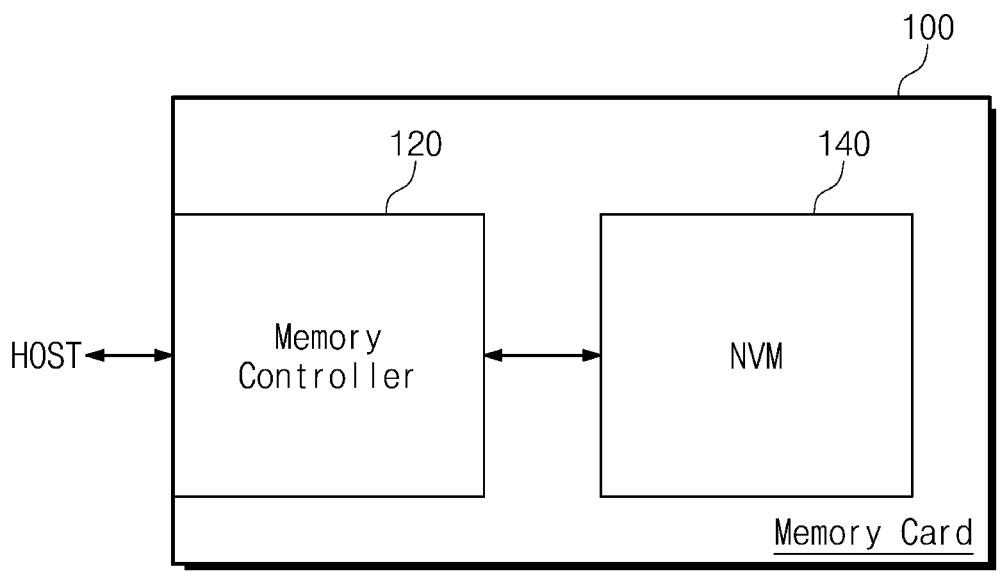
FIG. 3 is a block diagram illustrating a configuration of a memory card according to an example embodiment of the inventive concept.

FIG. 3 is a block diagram illustrating a configuration of the memory card 100 according to an example embodiment of the inventive concept. Referring to FIG. 3, the memory card 100 may include the memory controller 120 and the nonvolatile memory 140.

The memory controller 120 may be configured to control the nonvolatile memory 140. For example, in response to a request of a host, the memory controller 120 may write data to the nonvolatile memory 140 or may read data stored in the nonvolatile memory 140. To access the nonvolatile memory 140, the memory controller 120 may provide a command, an address, data, and a control signal to the nonvolatile memory 140.

Under control of the memory controller 120, the nonvolatile memory 140 may store data received from the memory controller 120 or may transmit data stored therein to the memory controller 120. The nonvolatile memory 140 may include a plurality of memory blocks. Each of the plurality of memory blocks may have a three-dimensional memory structure in which word line layers are stacked in a direction perpendicular to a substrate. The plurality of memory blocks may be respectively managed by the memory controller 120 by using information for wear-leveling such as a program/erase count.

Figure 4:
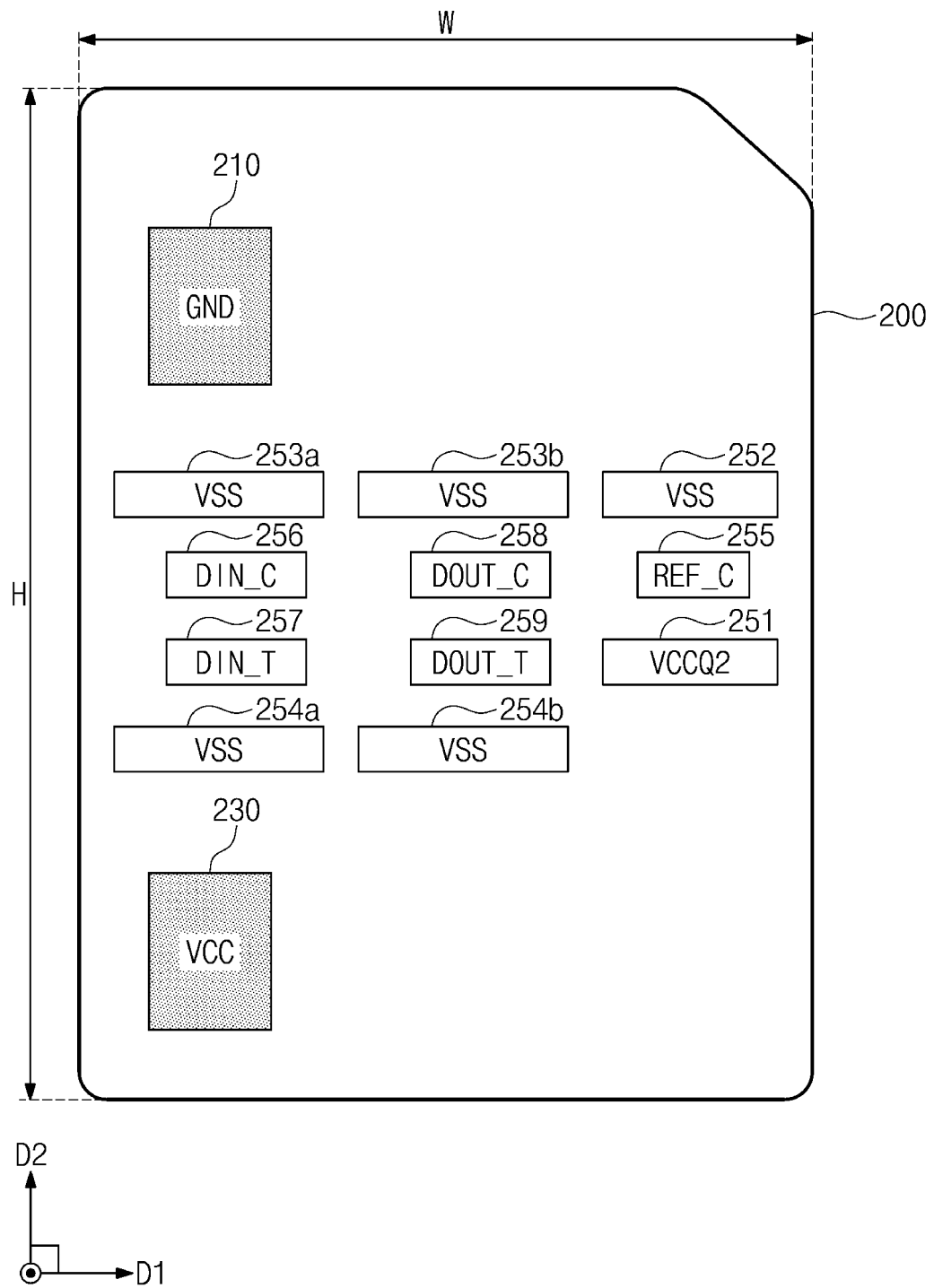
FIG. 4 is a diagram illustrating a memory card according to an example embodiment of the inventive concept.

FIG. 4 is a diagram illustrating a memory card according to an example embodiment of the inventive concept. Referring to FIG. 4, a memory card 200 may have the same width "W" and the same height "H" as the nano SIM card. The memory card 200 may have power terminals 210 and 230 and UFS terminals 251 to 259 arranged on a back surface of the memory card 200.

The power terminals 210 and 230 respectively arranged at the first row and the third row correspond to a first ground terminal 210 and a first power terminal 230 of FIG. 1, respectively. The first ground terminal 210 and the first power terminal 230 may be formed to be identical in position and size to those of FIG. 1. That is, the first ground terminal 210 may be formed, for example, to be identical in position to the ground terminal C5 of the nano SIM card having the same size as the memory card 200. That is, the first power terminal 230 may be formed, for example, to be identical in position to the ground terminal C1 of the nano SIM card having the same size as the memory card 200.

The UFS terminals 251 to 259 are arranged at the second row. Here, the UFS terminals 251 to 259 are not only arranged in the first direction D1 in the second row, but also arranged in the D2 direction within the second row. In the nano SIM card of the same size as the memory card 200, the USB signal terminals C4 and C8 may be arranged at the second row. The UFS terminals 251 to 259 may include a plurality of power terminals 251, 252, 253a, 253b, 254a, and 254b, a reference clock terminal 255, and data terminals 256, 257, 258, and 259. The UFS terminals 251 to 259 are formed in arrangement and shape that are desirable in the case where the memory card 200 is attached to or detached from a mobile device in the first direction D1. That is, each of the UFS terminals 251 to 259 may be arranged in such a way that a length in the first direction D1 is longer than a length in the second direction D2.

The second power terminal 251 of the plurality of power terminals 251, 252, 253a, 253b, 254a, and 254b is provided to receive the second power supply voltage VCCQ2 for driving the memory card 200. Here, the second power supply voltage VCCQ2 may have, for example, a value between approximately 1.0 V and approximately 2.2 V. The second power supply voltage VCCQ2 may be supplied to semiconductor devices operating at a high speed from among semiconductor devices in the memory card 200. For example, the second power supply voltage VCCQ2 may be supplied to at least one memory controller in the memory card 200.

The third power terminals 252, 253a, 253b, 254a, and 254b of the plurality of power terminals 251, 252, 253a, 253b, 254a, and 254b are provided to receive the third power supply voltage VSS. Here, the third power supply voltage VSS may correspond, for example, to the ground voltage GND. Accordingly, in this case, the power terminals 252, 253a, 253b, 254a, and 254b may be electrically connected with the first ground terminal 210.

The reference clock terminal 255 may be arranged between the second power terminal 251 and the second power terminal 252. To minimize a clock delay, the reference clock terminal 255 may be disposed at a position where a distance from a memory controller is minimized.

The data input terminals 256 and 257 are arranged between the third power terminals 253a and 254a. The data input terminals 256 and 257 may be terminals to receive complementary signals in the form of a differential signal. A noise or interference introduced into the data input terminals 256 and 257 may be minimized by disposing the data input terminals 256 and 257 between the third power terminals 253a and 254a of the ground level VSS.

The data output terminals 258 and 259 are arranged between the third power terminals 253b and 254b. The data output terminals 258 and 259 may be terminals to output a differential signal. Accordingly, a noise, which is introduced into the data output terminals 258 and 259, such as interference or crosstalk may be minimized.

For example, the memory card 200 may be attached to or detached from a mobile device in the first direction D1. Accordingly, contact pins in the mobile device and the UFS terminals 251 to 259 may be connected to be highly reliable. In addition, the UFS terminals 251 to 259 of the memory card 200 are arranged at positions corresponding to the USB signal terminals C4 and C8 of the nano SIM card. That is, the UFS terminals 251 to 259 are disposed side by side in the first direction D1 between the first ground terminal 210 and the first power terminal 230 (or at the second row). In addition, the first ground terminal 210 and the first power terminal 230 are formed at the same positions as the power terminal C1 and the ground terminal C5 of the nano SIM card.

The shapes and arrangements of contact terminals of the memory card 200 of the inventive concept are briefly described above. The memory card 200 of the inventive concept may have, for example, a width (W) of 8.8 mm and a height (H) 12.3 mm. The memory card 200 is identical in size to the nano SIM card. Although having the same size of the nano SIM card, the UFS terminals 251 to 259 for exchanging data and a clock signal are arranged at positions of the terminals C4 and C8 unused for data exchange at the nano SIM card.

Figure 5:
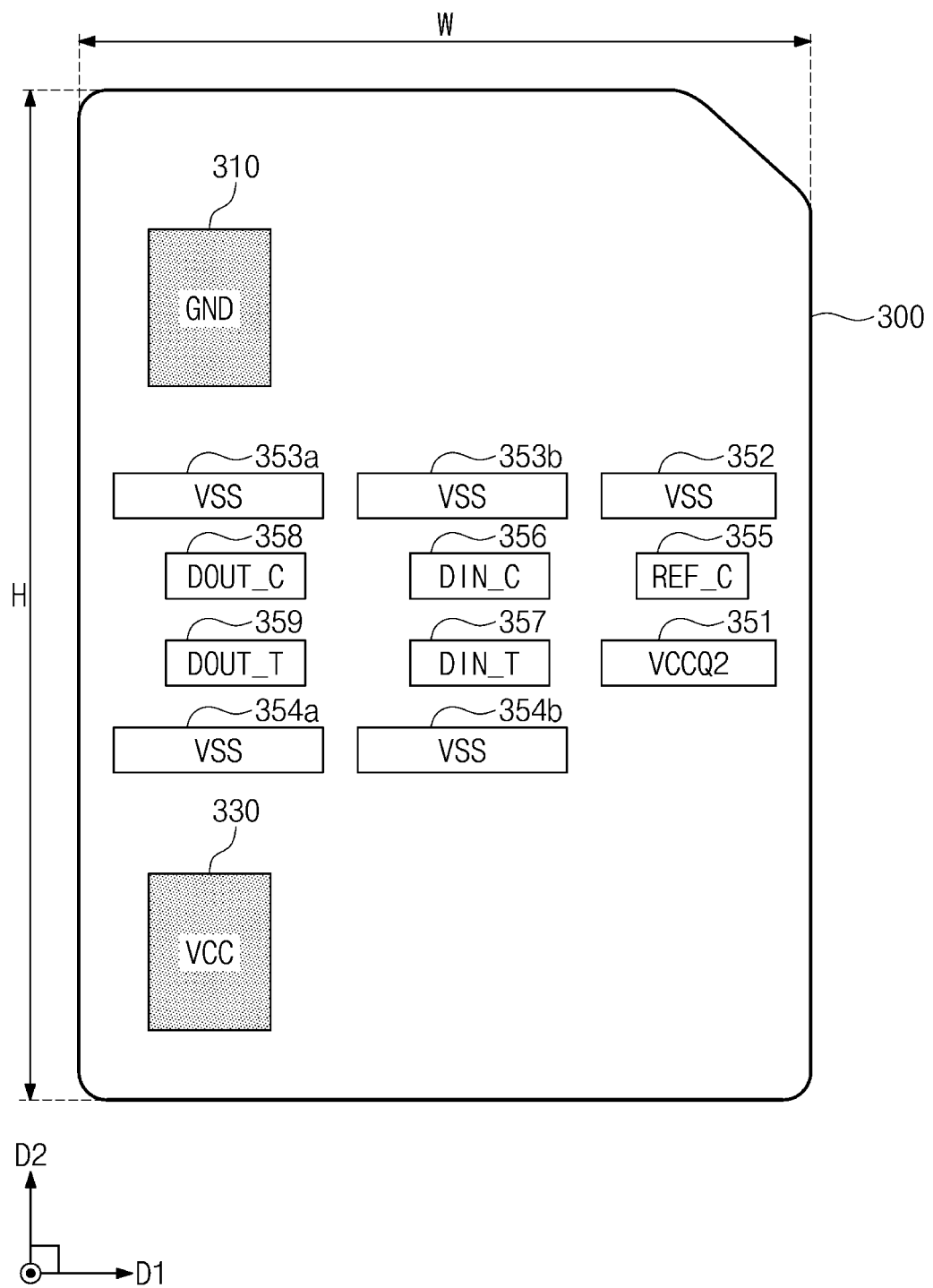
FIG. 5 is a diagram illustrating another example of a memory card according to an example embodiment of the inventive concept.

FIG. 5 is a diagram illustrating another example of a memory card according to an example embodiment of the inventive concept. Referring to FIG. 5, a memory card 300 may have the same width "W" and the same height "H" as the nano SIM card. The memory card 300 may include power terminals 310 and 330 and UFS terminals 351 to 359 arranged at the same positions as the nano SIM card. Here, the first ground terminal 310 and the first power terminal 330 arranged at the first row and the third row may be identical in position and shape to those of FIG. 1. Thus, additional description will be omitted to avoid redundancy.

The UFS terminals 351 to 359 are arranged at the second row. Here, the UFS terminals 351 to 359 are not only arranged in the first direction D1 in the second row, but also arranged in the D2 direction within the second row. The USB signal terminals C4 and C8 may be arranged at the second row of the nano SIM card of the same size as the memory card 300. The UFS terminals 351 to 359 may include a plurality of power terminals 351, 352, 353a, 353b, 354a, and 354b, a reference clock terminal 355, and data terminals 356, 357, 358, and 359. The UFS terminals 351 to 359 may be arranged in such a way that a length in the first direction D1 is longer than a length in the second direction D2.

The second power terminal 351 of the plurality of power terminals 351, 352, 353a, 353b, 354a, and 354b is provided to receive the second power supply voltage VCCQ2 for driving the memory card 300. Here, the second power supply voltage VCCQ2 may have, for example, a value between approximately 1.0 V and approximately 2.2 V.

The third power terminals 352, 353a, 353b, 354a, and 354b of the plurality of power terminals 351, 352, 353a, 353b, 354a, and 354b are provided to receive the third power supply voltage VSS. Here, the third power supply voltage VSS may correspond, for example, to the ground voltage GND. Accordingly, in this case, the power terminals 352, 353a, 353b, 354a, and 354b may be electrically connected with the first ground terminal 310.

The reference clock terminal 355 may be arranged between the second power terminal 351 and the second power terminal 352. To minimize a clock delay, the reference clock terminal 355 may be disposed at a position where a distance from a memory controller is minimized. The data output terminals 358 and 359 are arranged between the third power terminals 353a and 354a. The data output terminals 358 and 359 may be terminals to output a differential signal.

The data input terminals 356 and 357 are arranged between the third power terminals 353b and 354b. The data input terminals 356 and 357 may be terminals to receive complementary input signals in the form of a differential signal. A noise or interference introduced into the data input terminals 356 and 357 may be minimized by disposing the data input terminals 356 and 357 between the third power terminals 353b and 354b set to the ground level.

For example, the memory card 300 may be attached to or detached from a mobile device in the first direction D1. Accordingly, contact pins in the mobile device and the UFS terminals 351 to 359 may be connected to be highly reliable. In addition, the UFS terminals 351 to 359 of the memory card 300 are arranged at positions corresponding to the unused USB signal terminals C4 and C8 of the nano SIM card. Accordingly, the collision between the data signals does not occur at a nano SIM card slot. In addition, the first ground terminal 310 and the first power terminal 330 are arranged at the same positions as the power terminal C1 and the ground terminal C5 of the nano SIM card.

The shapes and arrangements of contact terminals of the memory card 300 of the inventive concept are briefly described above. The memory card 300 of the inventive concept may comply with the form factor having, for example, a width (W) of 8.8 mm and a height (H) of 12.3 mm. Although having the same size of the nano SIM card, the UFS terminals 351 to 359 of the memory card 300 for exchanging data and a clock signal are arranged at positions of the unused terminals C4 and C8 of the nano SIM card.

Figure 6:
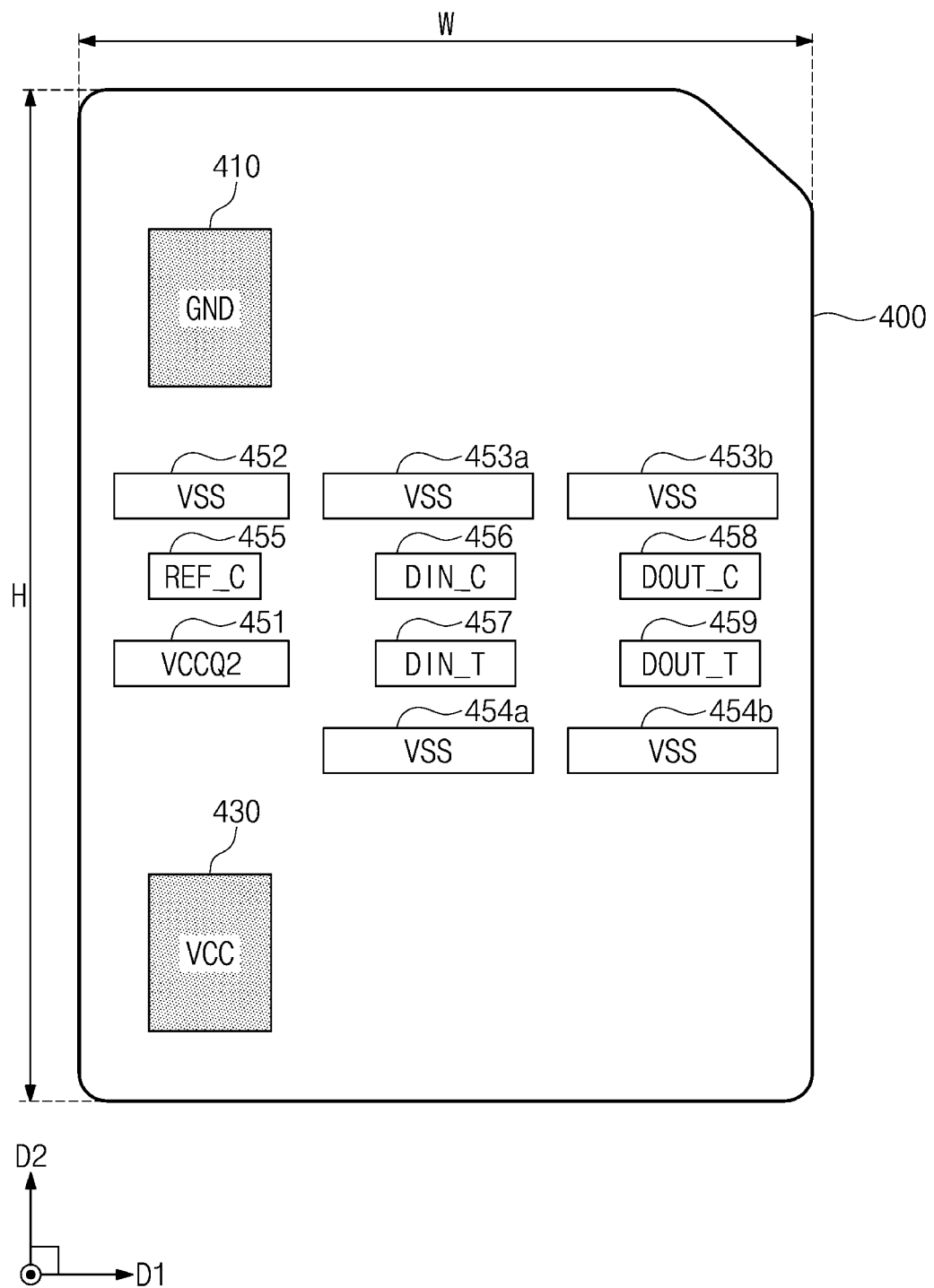
FIG. 6 is a diagram illustrating another example of a memory card according to an example embodiment of the inventive concept.

FIG. 6 is a diagram illustrating another example of a memory card according to an example embodiment of the inventive concept. Referring to FIG. 6, a memory card 400 may include first ground terminal 410 and first power terminal 430 and UFS terminals 451 to 459 arranged at the same positions as the nano SIM card.

The first ground terminal 410 and the first power terminal 430 arranged at the first row and the third row may be identical in position and shape to those of FIG. 1. That is, the first ground terminal 410 may be arranged, for example, at the same position as the ground terminal C5 of the nano SIM card. The first power terminal 430 may be arranged at the same position as the power terminal C1 of the nano SIM card.

The UFS terminals 451 to 459 are arranged at the second row. Here, the UFS terminals 451 to 459 are not only arranged in the first direction D1 in the second row, but also arranged in the D2 direction within the second row. The UFS terminals 451 to 459 of the memory card 400 of the inventive concept are arranged at positions of the USB signal terminals C4 and C8 of the nano SIM card. The UFS terminals 451 to 459 may include a plurality of power terminals 451, 452, 453a, 453b, 454a, and 454b, a reference clock terminal 455, and data terminals 456, 457, 458, and 459. The UFS terminals 451 to 459 are arranged in arrangement and shape that are desirable in the case where the memory card 400 is attached to or detached from a mobile device in the first direction D1. That is, the UFS terminals 451 to 459 may be arranged in such a way that a length in the first direction D1 is longer than a length in the second direction D2.

According to an example embodiment, the power terminals 451 and 452 and the reference clock terminal 455 are placed on the leftmost side column with respect the column-wise arrangement of the UFS terminals 451-459. The third power terminals 453b and 454b and the data output terminals 458 and 459 interposed therebetween are placed on the rightmost side. The third power terminals 453a and 454a and the data input terminals 456 and 457 interposed therebetween are placed on the center of the memory card 400.

The shapes and arrangements of contact terminals of the memory card 400 of the inventive concept are briefly described above. The memory card 400 of the inventive concept may have, for example, a width (W) of 8.8 mm and a height (H) of 12.3 mm. The memory card 200 is identical in size to the nano SIM card. Although having the same size of the nano SIM card, the UFS terminals 451 to 459 for exchanging data and a clock signal are arranged at positions of the terminals C4 and C8 unused for data exchange at the nano SIM card.

Figure 7:
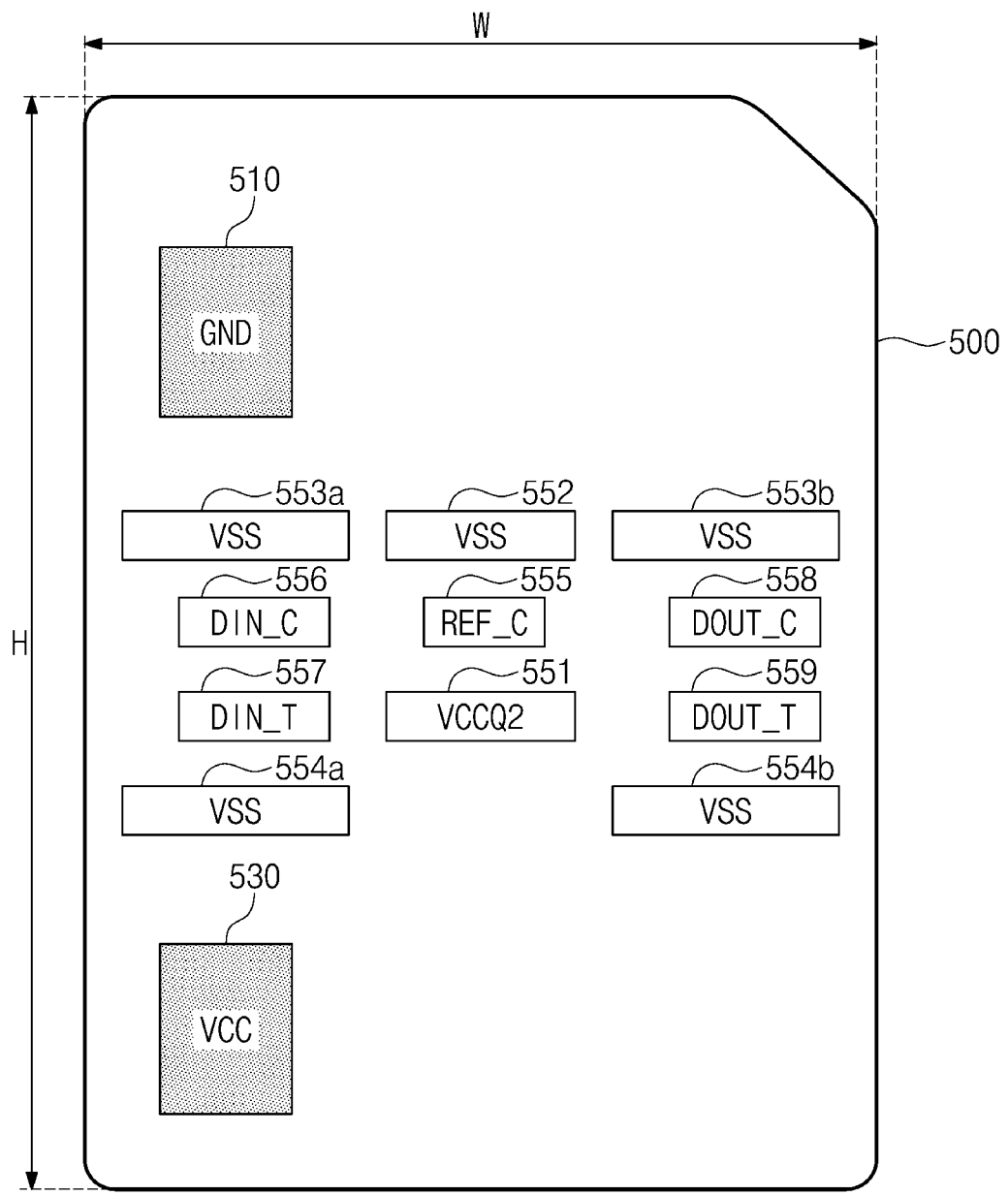
FIG. 7 is a diagram illustrating another example of a memory card according to example embodiment of the inventive concept.

FIG. 7 is a diagram illustrating a memory card according to another example embodiment of the inventive concept. Referring to FIG. 7, a memory card 500 may have the same width "W" and the same height "H" as the nano SIM card. The memory card 500 may include power terminals 510 and 530 arranged at the first row and the third row, and UFS terminals 551 to 559 arranged at the second row.

The first ground terminal 510 and the first power terminal 530 arranged at the first row and the third row may be identical in position and shape to those of FIG. 1. That is, the first ground terminal 510 may be arranged, for example, at the same position as the ground terminal C5 of the nano SIM card. The first power terminal 530 may be arranged at the same position as the power terminal C1 of the nano SIM card.

The UFS terminals 551 to 559 are arranged at the second row. Here, the UFS terminals 551 to 559 are not only arranged in the first direction D1 in the second row, but also arranged in the D2 direction within the second row. In the nano SIM card standard, the USB signal terminals C4 and C8 may be arranged at the second row where the UFS terminals 551 to 559 of the memory card 500 are arranged. The UFS terminals 551 to 559 may include a plurality of power terminals 551, 552, 553a, 553b, 554a, and 554b, a reference clock terminal 555, and data terminals 556, 557, 558, and 559. The UFS terminals 551 to 559 are arranged in arrangement and shape that are desirable in the case where the memory card 500 is attached to or detached from a mobile device in the first direction D1. That is, the UFS terminals 551 to 559 may be arranged in such a way that a length in the first direction D1 is longer than a length in the second direction D2.

In an embodiment, the power terminals 551 and 552 and the reference clock terminal 555 are placed on the center in the first direction D1. The third power terminals 553a and 554a and the data input terminals 556 and 557 interposed therebetween are placed on the leftmost side. The third power terminals 553b and 554b and the data output terminals 558 and 559 interposed therebetween are placed on the rightmost side.

For example, the memory card 500 may be attached to or detached from a mobile device in the first direction D1. Accordingly, contact pins in the mobile device and the UFS terminals 551 to 559 may be connected to be highly reliable.

The shapes and arrangements of contact terminals of the memory card 500 of the inventive concept are briefly described above. The memory card 500 of the inventive concept may have, for example, a width (W) of 8.8 mm and a height (H) of 12.3 mm. Although having the same size of the nano SIM card, the UFS terminals 551 to 559 for exchanging data and a clock signal are arranged at positions of the unused terminals C4 and C8 of the nano SIM card.

Figure 8:
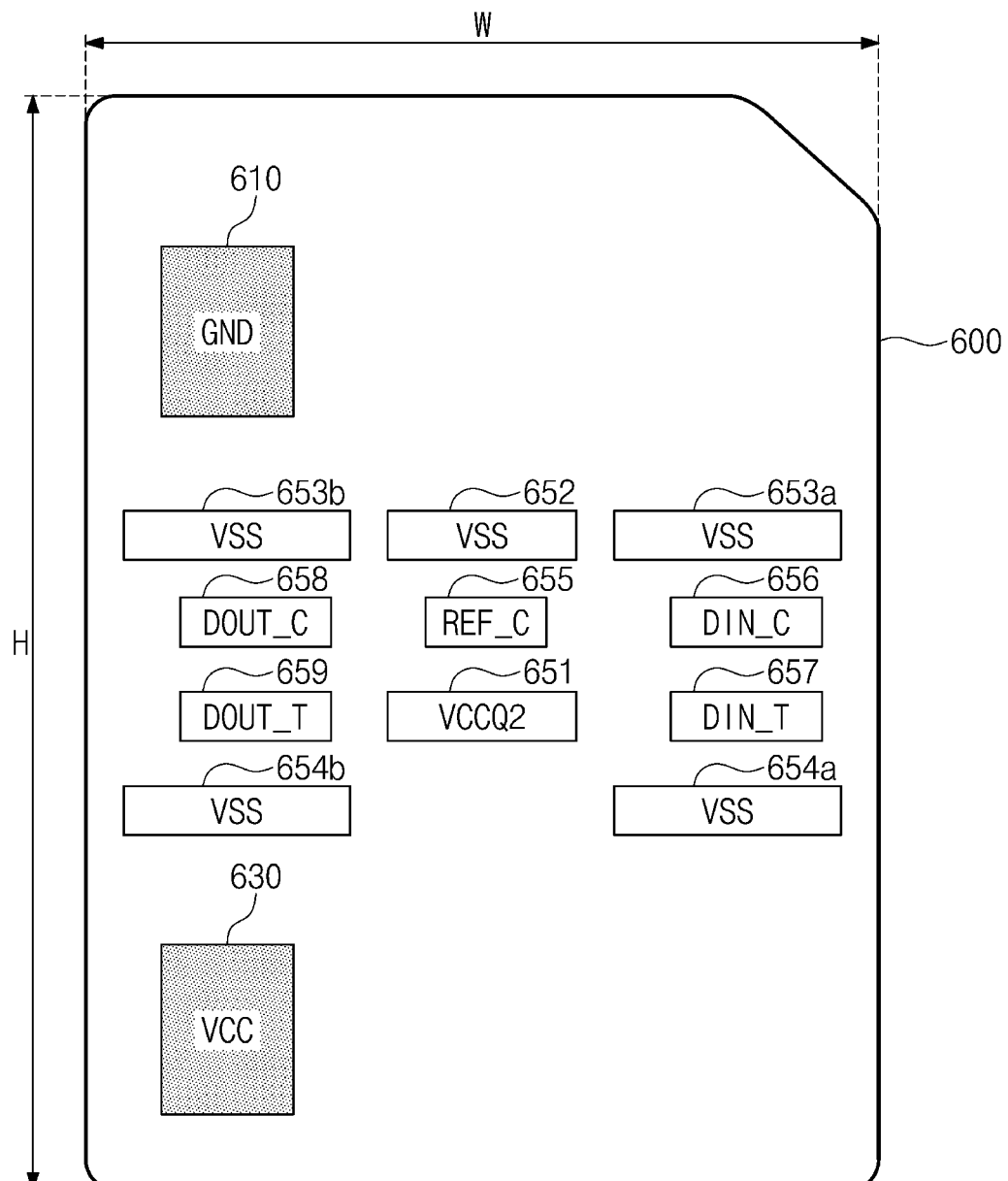
FIG. 8 is a diagram illustrating another example of a memory card according to an example embodiment of the inventive concept.
Figure 8:
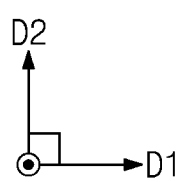

FIG. 8 is a diagram illustrating a memory card according to another embodiment of the inventive concept. Referring to FIG. 8, a memory card 600 may have the same width "W" and the same height "H" as the nano SIM card. The first ground terminal 610 and the first power terminal 630 630 and UFS terminals 651 to 659 may be arranged on a back surface of the memory card 600.

The first ground terminal 610 and the first power terminal 630 arranged at the first row and the third row may be identical in position and shape to those of FIG. 1. That is, the first ground terminal 610 may be arranged, for example, at the same position as the ground terminal C5 of the nano SIM card. The first power terminal 630 may be arranged at the same position as the power terminal C1 of the nano SIM card.

The UFS terminals 651 to 659 are arranged at the second row. Here, the UFS terminals 651 to 659 are not only arranged in the first direction D1 in the second row, but also arranged in the D2 direction within the second row. The UFS terminals 651 to 659 may include a plurality of power terminals 651, 652, 653*a*, 653*b*, 654*a*, and 654*b*, a reference clock terminal 655, and data terminals 656, 657, 658, and 659. The UFS terminals 651 to 659 are arranged in arrangement and shape that are desirable in the case where the memory card 600 is attached to or detached from a mobile device in the first direction D1. That is, the UFS terminals 651 to 659 may be arranged in such a way that a length in the first direction D1 is longer than a length in the second direction D2.

In an embodiment, the power terminals 651 and 652 and the reference clock terminal 655 are placed on the center in the first direction D1. In contrast, unlike the example of FIG. 7, the third power terminals 653*a* and 654*a* and the data input terminals 656 and 657 interposed therebetween are placed on the rightmost side. The third power terminals 653*b* and 654*b* and the data output terminals 658 and 659 interposed therebetween are placed on the leftmost side.

The shapes and arrangements of contact terminals of the memory card 600 of the inventive concept are briefly described above. The memory card 600 of the inventive concept may have, for example, a width (W) of 8.8 mm and a height (H) of 12.3 mm. The memory card 600 has the same size as the nano SIM card. However, the UFS terminals 651 to 659 for exchanging data and a clock signal are arranged at positions of the unused terminals C4 and C8 of the nano SIM card (i.e., at the second row).

Figure 9A:
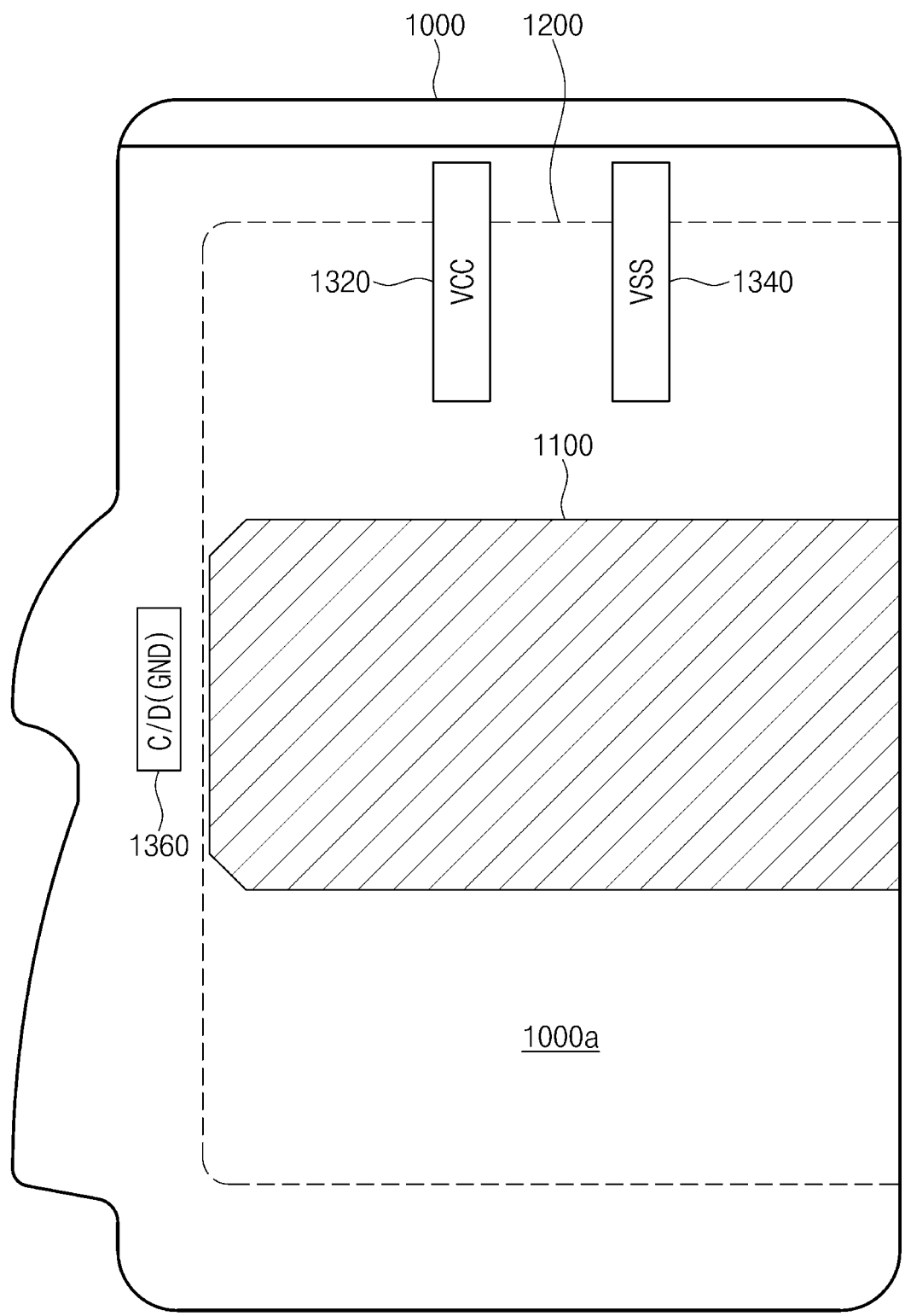
FIGS. 9A and 9B are diagrams illustrating a UFS card adaptor for inserting a memory card of the inventive concept into a UFS card slot.
Figure 9B:
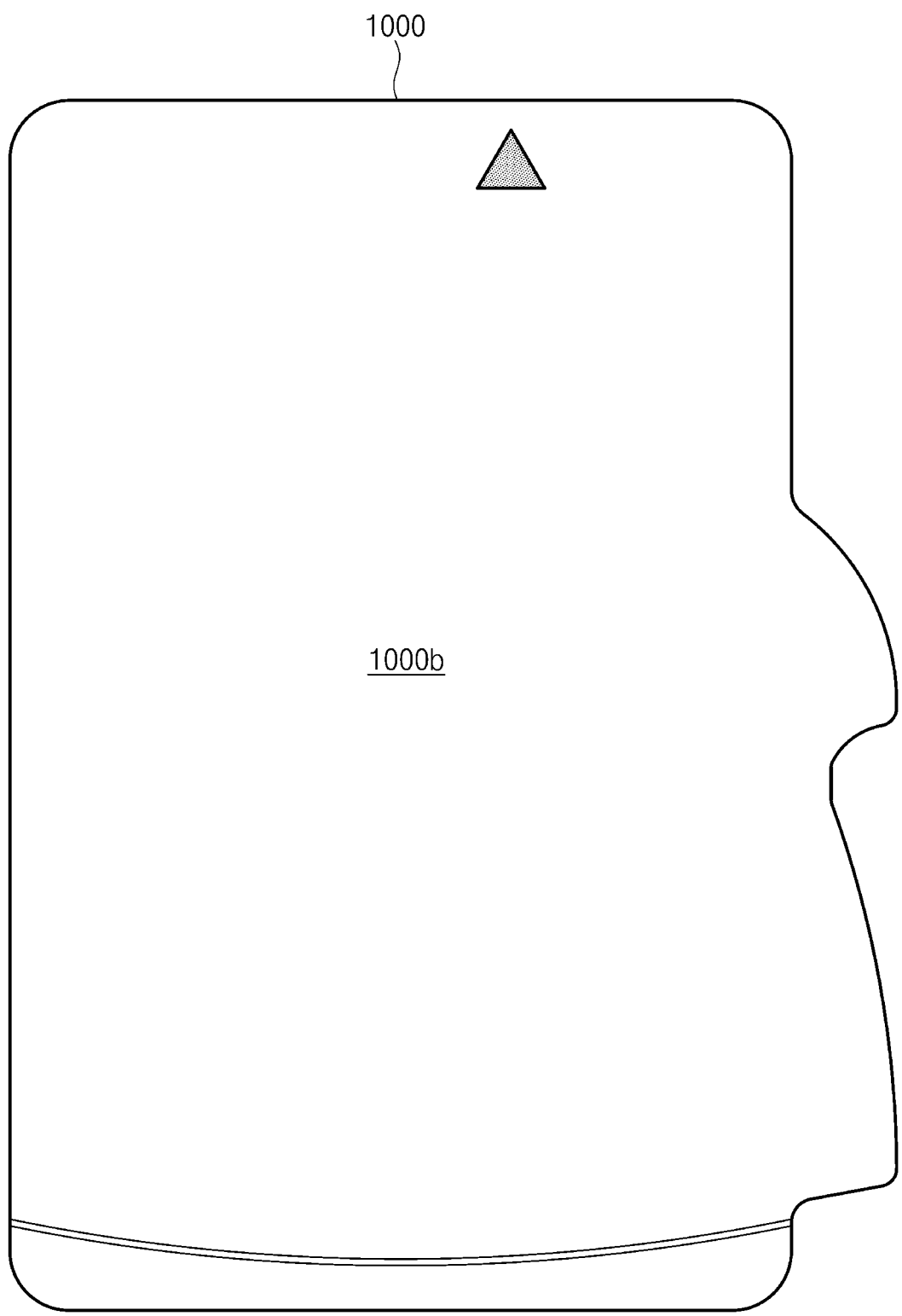

FIGS. 9A and 9B are diagrams illustrating a UFS card adaptor for inserting a memory card of the inventive concept into a UFS card slot. FIG. 9A shows terminals arranged on a back surface 1000*a* of a UFS card adaptor 1000, and FIG. 9B shows a front surface of the UFS card adaptor 1000. Referring to FIGS. 9A and 9B, socket terminals 1320, 1340, and 1360 and an opening 1100 corresponding to a hatching portion are formed on the back surface 1000*a* of the UFS card adaptor 1000. A socket 1200 for accommodating a memory card of the inventive concept is formed within the UFS card adaptor 1000.

The socket terminals 1320, 1340, and 1360 include a power terminal 1320, a ground terminal 1340, and a card detection terminal 1360. The power terminal 1320 is formed to provide the first power supply voltage VCC to the UFS card adaptor 1000. The ground terminal 1340 is formed to provide the ground voltage VSS to the UFS card adaptor 1000. The card detection terminal 1360 performs a role of recognizing a memory card mounted on a mobile device as a UFS card when the UFS card adaptor 1000 coupled with the memory card 100 of the inventive concept is inserted into a card slot of the mobile device.

When the memory card 100 of the inventive concept is inserted into the socket 1200, the UFS terminals 151 to 159 of the memory card 100 are exposed through the opening 1100. The first ground terminal 110 of the memory card 100 is electrically connected with the ground terminal 1340 and the card detection terminal 1360 of the UFS card adaptor 1000. Also, the first power terminal 130 of the memory card 100 is electrically connected with the power terminal 1320 of the UFS card adaptor 1000.

According to the above connection relationship and the exposure of the UFS terminals 151 to 159 through the opening 1100, the UFS card adaptor 1000 into which the memory card 100 is inserted may be used as a memory card compliant with the UFS card standard.

Figure 10:
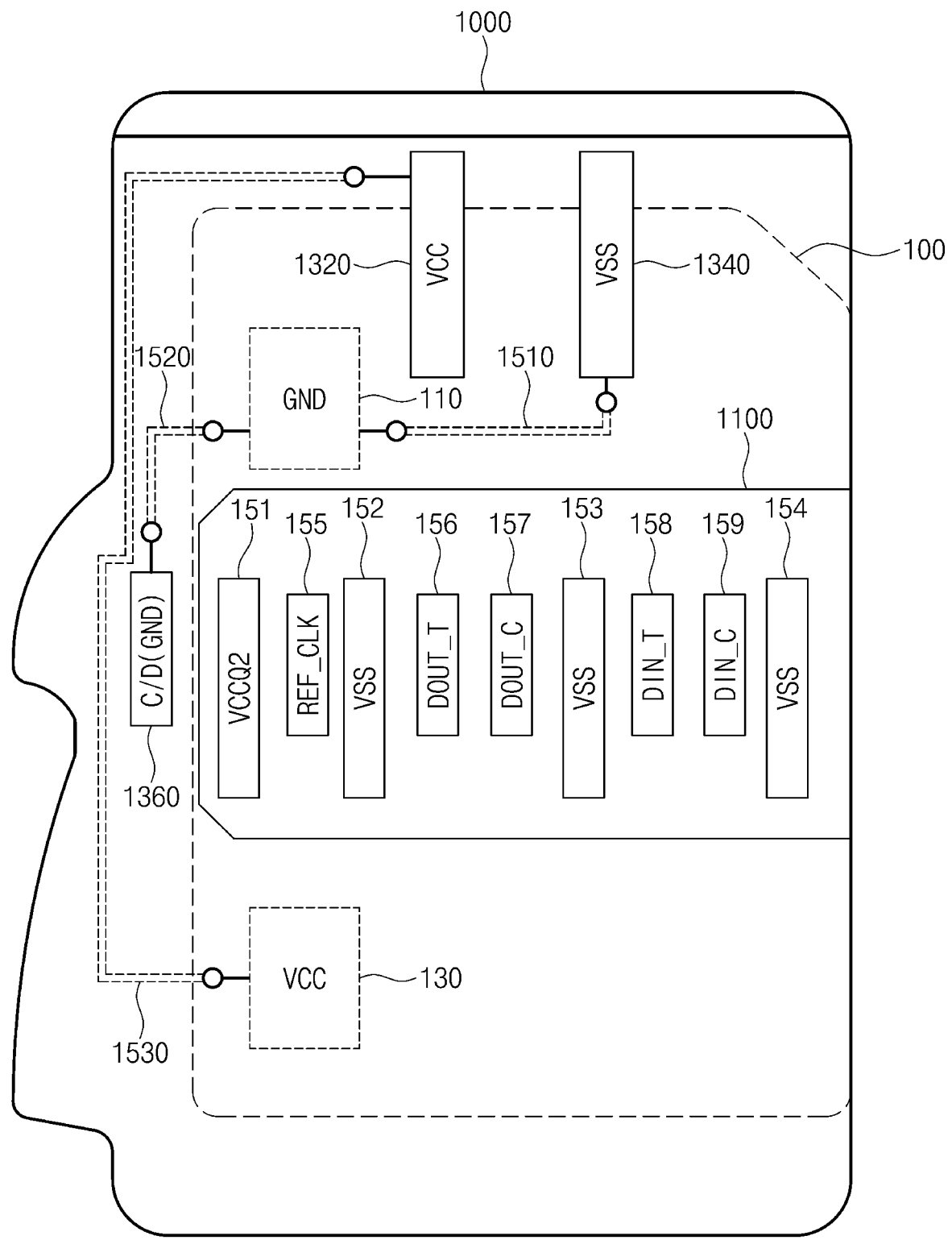
FIG. 10 is a diagram illustrating a shape of a UFS card adaptor into which a memory card is inserted and a connection relationship of terminals.

FIG. 10 is a diagram illustrating a shape of a UFS card adaptor into which a memory card is inserted and a connection relationship of terminals. Referring to FIG. 10, when the memory card 100 is inserted into the UFS card adaptor 1000, the memory card 100 and the UFS card adaptor 1000 are recognized as one complete UFS memory card and operates as one complete UFS memory.

When the memory card 100 is completely inserted into the UFS card adaptor 1000, the UFS terminals 151 to 159 of the memory card 100 are exposed to the outside through the opening 1100. The first ground terminal 110 of the memory card 100 is electrically connected with the ground terminal 1340 and the card detection terminal 1360 of the UFS card adaptor 1000. That is, the first ground terminal 110 of the memory card 100 may be connected with a contact terminal formed within the UFS card adaptor 1000, and the contact terminal may be connected with the ground terminal 1340 through a wire line 1510. Also, the first ground terminal 110 may be connected with the card detection terminal 1360 through a wire line 1520 formed within the UFS card adaptor 1000.

The first power terminal 130 of the memory card 100 may be electrically connected with a contact terminal provided within the UFS card adaptor 1000. The contact terminal may be electrically connected with the power terminal 1320 through a wire line 1530 formed within the UFS card adaptor 1000. The wire lines 1510, 1520, and 1530 may be implemented through routing of a conductor formed within the UFS card adaptor 1000.

When the memory card 100 and the UFS card adaptor 1000 are coupled, the socket terminals 1320, 1340, and 1360 and the UFS terminals 151 to 159 may be mounted on the UFS card slot, and thus, the memory card 100 may be recognized as a UFS card.

Figure 11:
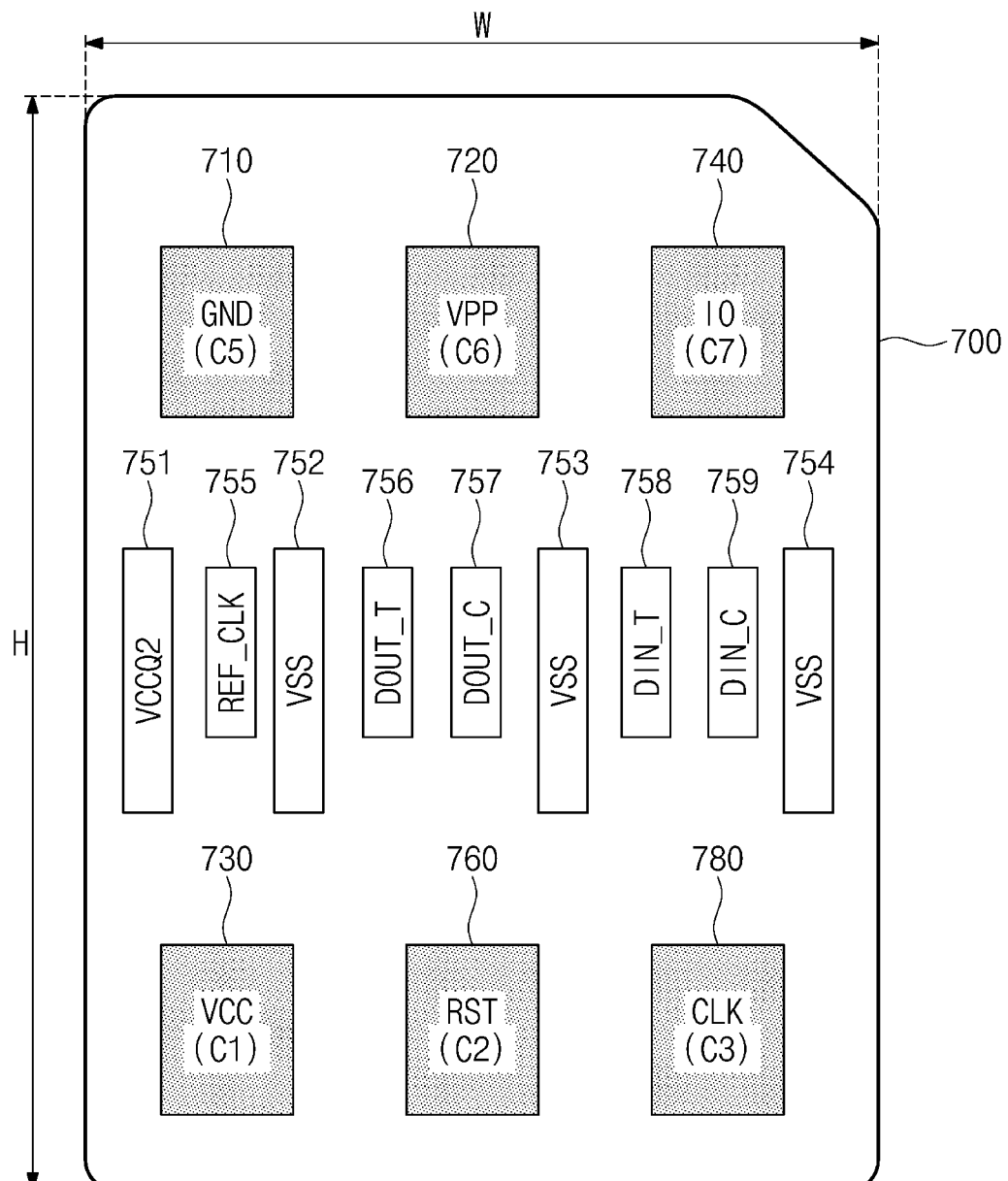
FIG. 11 is a diagram illustrating a combo card according to another example embodiment of the inventive concept.

FIG. 11 is a diagram illustrating a combo card according to another example embodiment of the inventive concept. Referring to FIG. 11, a combo card 700 of the inventive concept may provide both a memory card function and a SIM card function. The combo card 700 may include SIM terminals 710, 720, 730, 740, 760, and 780 and UFS terminals 751 to 759 formed at the same positions as the nano SIM card. The combo card 700 may have the same size (8.8 mm×12.3 mm) as the nano SIM card. The terminals of the combo card 700 may be arranged at a first row to a third row.

The first ground terminal 710 and the first power terminal 730 of the SIM terminals 710, 720, 730, 740, 760, and 780 arranged at the first row and the third row may be used as common terminals. That is, the first ground terminal 710 and the first power terminal 730 provide a power and a ground to both a memory card and a SIM card. For example, the first ground terminal 710 and the first power terminal 730 may be used to provide a power to both a memory controller and a SIM controller. The first ground terminal 710 corresponds to a "C5" terminal for providing the ground voltage GND in the nano SIM card standard. The first power terminal 730 corresponds to a "C1" terminal for providing the power supply voltage VCC in the nano SIM card standard. The power supply voltage VCC may be, for example, 3 V to 5 V.

The SIM terminal 720 corresponds to a "C6" terminal for providing a high voltage VPP in the nano SIM card standard. The SIM terminal 720 is used for a single wire protocol SWP for near field communication (NFC) and provides a channel for exchanging information for operating an NFC-related function. The SIM terminal 740 corresponds to an input/output (I/O) terminal for exchanging information for communication between the combo card 700 and a mobile device, that is, a "C7" terminal. The SIM terminal 740 provides a path for exchanging subscriber information of the combo card 700 with the mobile device. The SIM terminal 760 corresponds to a "C2" terminal for receiving a reset signal RST in the nano SIM card standard. The SIM terminal 780 corresponds to a "C3" terminal for receiving a clock signal CLK in the nano SIM card standard.

The UFS terminals 751 to 759 are arranged at the second row of the combo card 700. Currently unused USB terminals C4 and C8 are arranged at the second row of the nano SIM card. The UFS terminals 751 to 759 are memory card-dedicated terminals for an operation and data exchange of a UFS memory card. An example is illustrated as the arrangement of the UFS terminals 751 to 759 is identical to the arrangement of the UFS terminals 151 to 159 of FIG. 1. The UFS terminals 751 to 759 are configured to have the same functions as the UFS terminals 151 to 159 of FIG. 1. However, the arrangement of the UFS terminals 751 to 759 of the combo card 700 of the inventive concept is not limited to the above disclosure. For example, the UFS terminals 751 to 759 may be provided depending on at least one of the UFS terminal arrangements of FIGS. 4 to 8.

In the case where the combo card 700 is mounted on a mobile device, the combo card 700 may provide a nano SIM card function and a USF memory card function at the same time. According to the combo card 700, it is possible to reduce the size of a socket tray without the inconvenience that a memory card and a SIM card are separately mounted.

Figure 12:
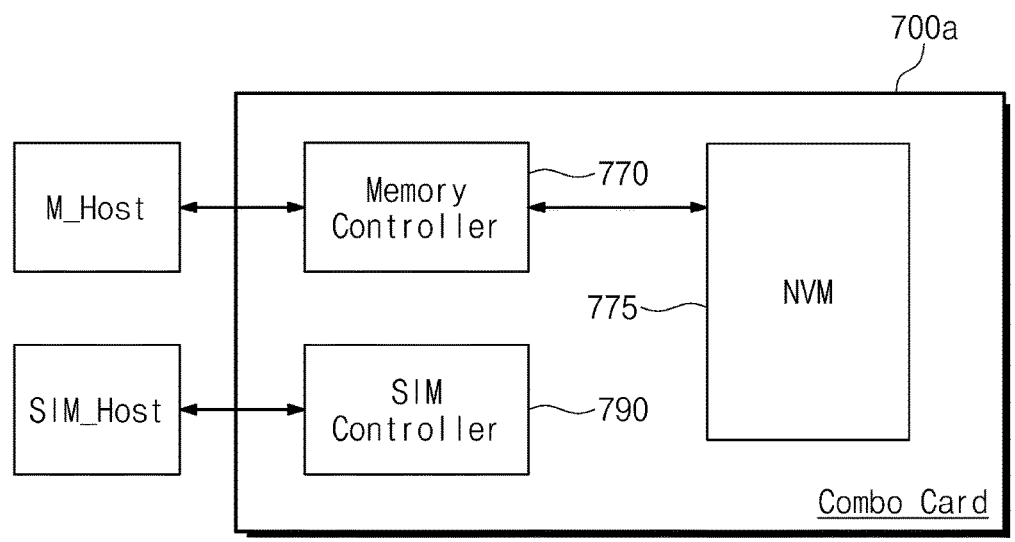
FIG. 12 is a block diagram illustrating an example of a configuration of a combo card according to another example embodiment of the inventive concept.

FIG. 12 is a block diagram illustrating an example of a configuration of a combo card of the inventive concept. Referring to FIG. 12, a combo card 700a may include a memory controller 770, a nonvolatile memory 775, and a SIM controller 790.

The memory controller 770 may be configured to control the nonvolatile memory 775. For example, in response to a request of a memory host M_Host, the memory controller 770 may write data to the nonvolatile memory 775 or may read data stored in the nonvolatile memory 775. To access the nonvolatile memory 775, the memory controller 770 may provide a command, an address, data, and a control signal to the nonvolatile memory 775. Through the common SIM terminals 710 and 730 and the UFS terminals 751 to 759 described above, the memory controller 770 may be supplied with a power or may perform communication with the memory host M_Host.

Under control of the memory controller 770, the nonvolatile memory 775 may store data or may provide data stored therein to the memory controller 770. The nonvolatile memory 775 may include a plurality of memory blocks. Each of the plurality of memory blocks may have a three-dimensional memory structure in which word line layers are stacked in a direction perpendicular to a substrate.

The SIM controller 790 may provide subscriber information in response to a request of a SIM host SIM_Host and may verify an authentication vector provided from the SIM host SIM_Host. That is, for subscriber authentication with the SIM host SIM_Host, the SIM controller 790 may process information associated with the subscriber authentication and may provide the processed information to the SIM host SIM_Host. The SIM controller 790 may communicate with the SIM host SIM_Host (e.g., a mobile device) by using the SIM terminals 710, 720, 730, 740, 760, and 780.

According to the combo card 700a, the memory controller 770 and the SIM controller 790 may communicate with the outside independently of each other. Accordingly, the combo card 700 of the inventive concept may be mounted on a mobile device compatible therewith and may simultaneously provide a memory card function and a SIM card function.

Figure 13:
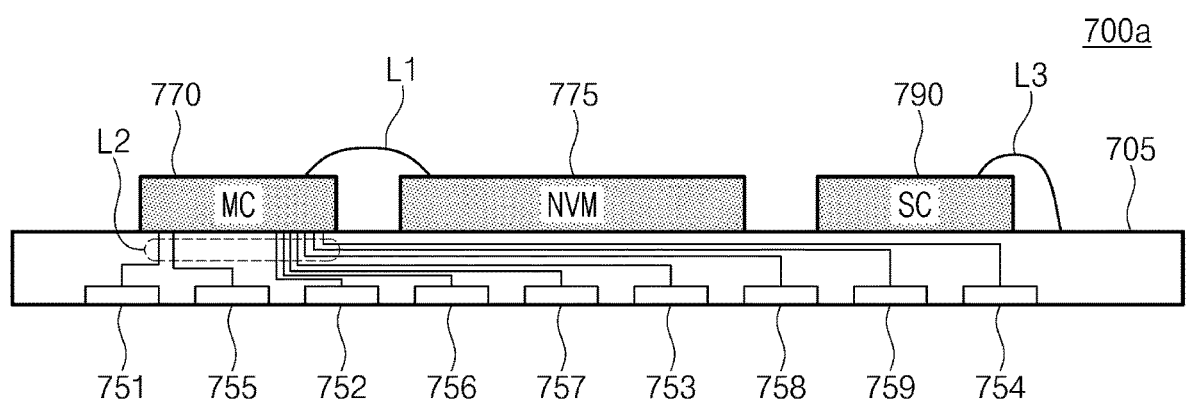
FIG. 13 is a cross-sectional view schematically illustrating a configuration of a combo card of FIG. 12.

FIG. 13 is a cross-sectional view schematically illustrating a configuration of a combo card of FIG. 12. Referring to FIG. 13, the combo card 700a may include the memory controller 770, the nonvolatile memory 775, and the SIM controller 790 disposed on an upper surface of a substrate 705. The SIM terminals 710, 720, 730, 740, 760, and 780 and the UFS terminals 751 to 759 may be formed on a lower surface of the substrate 105. However, positions, sizes, and a connection relationship of components mentioned herein are exemplary, and the positions, sizes, and connection relationship are not limited to the disclosure.

The memory controller 770 is connected with the nonvolatile memory 775 through the wire L1. The wire L1 may include a plurality of data lines for exchanging a command, an address, data, and a control signal between the memory controller 770 and the nonvolatile memory 775. The wire L1 is illustrated in the form of a bonding wire electrically connecting the memory controller 770 and the nonvolatile memory 775, but the inventive concept is not limited thereto. That is, the wire L1 may be implemented by using a silicon through via (TSV) and a printed circuit pattern formed on the substrate 705.

The common SIM terminals 710 and 730 and the UFS terminals 751 to 759 are electrically connected with the memory controller 770. Here, because FIG. 13 is the cross-sectional view of the combo card 700 taken along the second row, the SIM terminals 710 and 730 are not shown. The UFS terminals 751 to 759 may be connected with the memory controller 770 through a wire L2. The UFS terminals 751 to 759 may be electrically connected with the memory controller 770 through a wire, a printed circuit pattern formed on an upper or lower surface of the substrate 705, or a wire layer or a through via (TSV) formed in the substrate 705.

According to an example embodiment, the nonvolatile memory 775 may also be electrically connected with the SIM terminals 710 and 730 through a wire, a printed circuit pattern formed on an upper or lower surface of the substrate 705, or a wire layer or a through via (TSV) formed in the substrate 705.

The SIM controller 790 is connected with the SIM terminals 710, 720, 730, 740, 760, and 780 through a wire L3. The SIM controller 790 may communicate with the SIM host SIM_Host by using the wire L3 and the SIM terminals 710, 720, 730, 740, 760, and 780.

Figure 14:
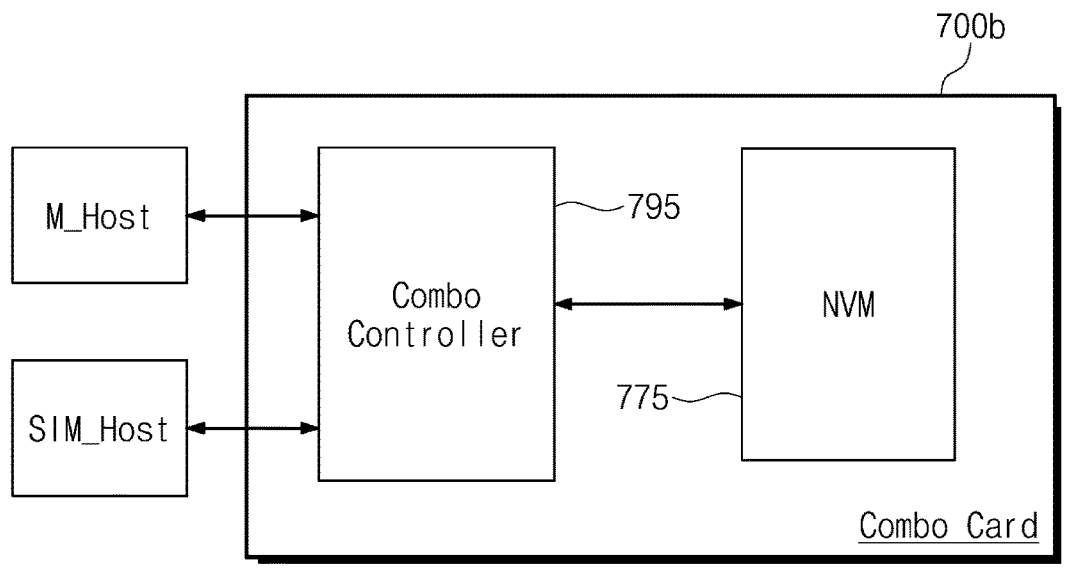
FIG. 14 is a block diagram illustrating another example of a configuration of a combo card according to another example embodiment of the inventive concept.

FIG. 14 is a block diagram illustrating another example of a configuration of a combo card of the inventive concept. Referring to FIG. 14, a combo card 700b may include a combo controller 795 and the nonvolatile memory 775.

The combo controller 795 may perform all functions of a SIM controller and a memory controller controlling the nonvolatile memory 775. In response to a request of the memory host M_Host, the combo controller 795 may write data to the nonvolatile memory 775 or may read data stored in the nonvolatile memory 775. To access the nonvolatile memory 775, the combo controller 795 may provide a command, an address, data, and a control signal to the nonvolatile memory 775.

Through the SIM terminals 710 and 730 and the UFS terminals 751 to 759 described above, the combo controller 795 may be supplied with a power or may perform communication with the memory host M_Host. Under control of the combo controller 795, the nonvolatile memory 775 may store data or may provide data stored therein to the combo controller 795.

In addition, the combo controller 795 may provide information for subscriber authentication depending on a request of the SIM host SIM_Host. The combo controller 795 may communicate with the SIM host SIM_Host by using the SIM terminals 710, 720, 730, 740, 760, and 780.

Through the combo controller 795, the combo card 700b may communicate with the memory host M_Host and the SIM host SIM_Host. The combo card 700b may be mounted on a mobile device including an interface capable of communicating with the combo card 700b and may simultaneously provide a memory card function and a SIM card function.

Figure 15:
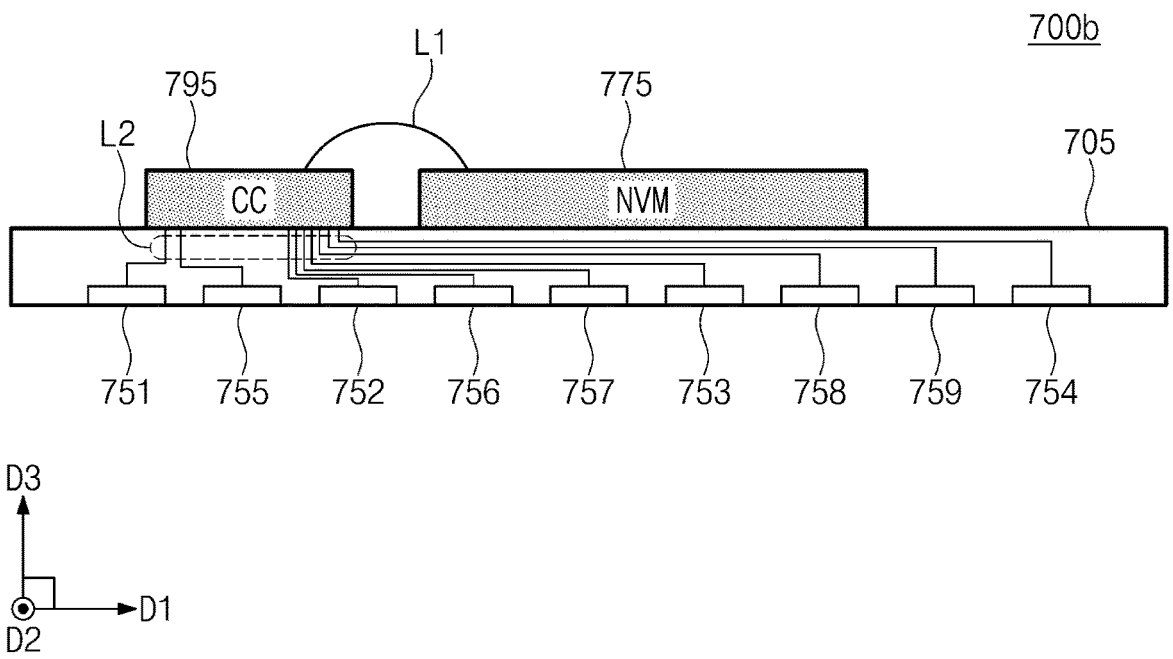
FIG. 15 is a cross-sectional view schematically illustrating a configuration of a combo card of FIG. 14.

FIG. 15 is a cross-sectional view schematically illustrating a configuration of a combo card of FIG. 14. Referring to FIG. 15, the combo card 700b may include the combo controller 795 and the nonvolatile memory 775 disposed on an upper surface of the substrate 705. The SIM terminals 710, 720, 730, 740, 760, and 780 and the UFS terminals 751 to 759 may be formed on a lower surface of the substrate 705. However, positions, sizes, and a connection relationship of components mentioned herein are exemplary, and the positions, sizes, and connection relationship are not limited to the disclosure.

The combo controller 795 is connected with the nonvolatile memory 775 through the wire L1. The wire L1 may include a plurality of data lines for exchanging a command, an address, data, and a control signal between the combo controller 795 and the nonvolatile memory 775. The wire L1 is illustrated in the form of a bonding wire electrically connecting the combo controller 795 and the nonvolatile memory 775, but the inventive concept is not limited thereto. That is, the wire L1 may be implemented by using a silicon through via (TSV) and a printed circuit pattern formed on the substrate 705.

The SIM terminals 710, 720, 730, 740, 760, and 780 and the UFS terminals 751 to 759 are electrically connected with the combo controller 795. Here, because FIG. 15 is the cross-sectional view of the combo card 700 taken along the second row, the SIM terminals 710, 720, 730, 740, 760, and 780 are not shown. The UFS terminals 751 to 759 may be connected with the combo controller 795 through the wire L2. The UFS terminals 751 to 759 may be electrically connected with the combo controller 795 through a wire, a printed circuit pattern formed on an upper or lower surface of the substrate 705, or a wire layer or a through via (TSV) formed in the substrate 705.

According to an example embodiment, the nonvolatile memory 775 may also be electrically connected with the SIM terminals 710 and 730 through a wire, a printed circuit pattern formed on an upper or lower surface of the substrate 705, or a wire layer or a through via (TSV) formed in the substrate 705.

According to an embodiment of the inventive concept, it may be possible to implement a UFS memory card having the same size and shape as a nano SIM card. In addition, the UFS memory card of the inventive concept may include a connection terminal capable of being used in common with the nano SIM card, thus improving the availability of space.

According to an example embodiment, at least one of the components, elements, modules or units (collectively "components" in this paragraph) represented by a block in the drawing, i.e., in FIGS. 3, 12 and 14, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory card which includes at least one nonvolatile memory and a memory controller, the memory card comprising:
   a first ground terminal arranged in a first row, and configured to provide a ground voltage to the at least one nonvolatile memory or the memory controller;
   a plurality of universal flash storage (UFS) terminals arranged in a second row; and a first power terminal arranged in a third row, and configured to provide a first power supply voltage (VCC) to the at least one nonvolatile memory or the memory controller, wherein the plurality UFS terminals comprises a first UFS terminal configured to provide a second power, a second UFS terminal configured to provide a reference clock signal, and a third UFS terminal configured to provide a path for input/output data to the memory controller, wherein the memory card has a size or a dimension defined by a nano subscriber identification module (SIM) card standard, wherein the first ground terminal corresponds to a "C5" terminal of the nano SIM card standard, wherein the first power terminal corresponds to a "C1" terminal of the nano SIM card standard, wherein the plurality UFS terminals are arranged in an area corresponding to "C4" terminal and "C8" terminal in the standard the nano SIM card, and wherein the plurality UFS terminals are arranged in a first direction, which is same as a direction in which the "C4" terminal and the "C8" terminal are arranged in the standard nano SIM card.

2. The memory card of claim 1, wherein the size or the dimension of the memory card is 12.3 mm (H) by 8.8 mm (W).

3. The memory card of claim 1, wherein:
the first UFS terminal is a second power terminal configured to provide the second power to the memory controller,
the second UFS terminal is a reference clock terminal for transferring the reference clock signal to the memory controller, and
the third UFS terminal is a data input/output terminal connected with the memory controller.

4. The memory card of claim 3, wherein the second power has a second power supply voltage (VCCQ2) lower than the first power supply voltage (VCC).

5. The memory card of claim 3, wherein the second power terminal, the at least one data input/output terminal, and the reference clock terminal arranged in a first direction corresponding to an arrangement of the first row, the second row and the third row.

6. The memory card of claim 1, further comprising:
a removable UFS card adaptor including an opening through which the UFS terminals are exposed when the removable UFS card adaptor is coupled with the memory card, and
a card detection terminal electrically connected with the first ground terminal.

7. The memory card of claim 6, wherein the card detection terminal is provided on a side of one of the UFS terminals.

8. The memory card of claim 6, wherein the UFS card adaptor further includes:
a third power terminal connected with the first power terminal and a second ground terminal connected the first ground terminal when the UFS card adaptor is coupled with the memory card.

9. The memory card of claim 6, wherein the UFS card adaptor complies with a standard of a UFS card having the size or the dimension of 11.0 mm (W) by 15.0 mm (H).

10. The memory card of claim 1, further comprising:
a SIM controller, and
at least one SIM terminal formed at each of the first row and the third row and configured to facilitate communication between the SIM controller and a host.

11. The memory card of claim 10, wherein a "C6" terminal or a "C7" terminal of the nano SIM card standard is included in the first row, and a "C2" terminal or a "C3" terminal of the nano SIM card standard is included in the third row.

12. A combo card which includes at least one nonvolatile memory, a memory controller controlling the at least one nonvolatile memory, and a SIM controller storing or providing subscriber information, the combo card comprising:
a first terminal group including a "C5" terminal, a "C6" terminal, and a "C7" terminal of a nano SIM card standard arranged in a first row of a back surface of the combo card;
a second terminal group including universal flash storage (UFS) terminals arranged in a second row of the back surface and providing a power, a reference clock signal, and a path for input/output data to the memory controller; and
a third terminal group including a "C1" terminal, a "C2" terminal, and a "C3" terminal of the nano SIM card standard arranged in a third row of the back surface,
wherein the combo card has a size or a dimension of 12.3 mm×8.8 mm,
wherein the second terminal group including the UFS terminals is arranged in an area corresponding to "C4" terminal and "C8" terminal in the standard the nano SIM card, and
wherein the second terminal group including the UFS terminals are arranged in a first direction, which is same as a direction in which the "C4" terminal and the "C8" terminal are arranged in the standard nano SIM card.

13. The combo card of claim 12, wherein the "C5" terminal and the "C1" terminal are connected in common to supply a first power supply voltage to the nonvolatile memory, the memory controller, and the SIM controller.

14. The combo card of claim 13, wherein the second terminal group includes a UFS power terminal for providing a second power supply voltage to the memory controller.

15. The combo card of claim 12, wherein the memory controller and the SIM controller are formed on a single chip.

16. A memory card which includes at least one nonvolatile memory and a memory controller and has a size or a dimension of 12.3 mm×8.8 mm, the memory card comprising:
a first ground terminal arranged in a first row to provide a ground voltage to the at least one nonvolatile memory or the memory controller;
a plurality of universal flash storage (UFS) terminals arranged in a second row to transfer a power, a reference clock signal, and data to the memory controller; and
a first power terminal formed at a third row to provide a first power supply voltage (VCC) to the at least one nonvolatile memory or the memory controller,
wherein the plurality of UFS terminals comprises a first UFS terminal configured to provide a second power to the memory controller, a second UFS terminal configured to provide a reference clock signal, and a third UFS terminal configured to provide data to the memory controller,
wherein the plurality UFS terminals are arranged in an area corresponding to "C4" terminal and "C8" terminal in a standard nano SIM card, and
wherein the plurality UFS terminals are arranged in a first direction, which is same as a direction in which the "C4" terminal and the "C8" terminal are arranged in the standard the nano SIM card.

17. The memory card of claim 16, wherein the second power is a second power supply voltage (VCCQ2) lower than the first power supply voltage (VCC).

18. The memory card of claim 16, wherein the first ground terminal corresponds to a position of a "C5" terminal of a nano SIM card standard corresponding to the memory card.

19. The memory card of claim 18, wherein the first power terminal corresponds to a position of a "C1" terminal of the nano SIM card standard.

20. The memory card of claim 16, wherein the second row is between the first row and the third row.

* * * * *